United States Patent
Miki et al.

(10) Patent No.: US 8,168,460 B2
(45) Date of Patent: May 1, 2012

(54) METHOD FOR MANUFACTURING GROUP III NITRIDE COMPOUND SEMICONDUCTOR LIGHT-EMITTING DEVICE, GROUP III NITRIDE COMPOUND SEMICONDUCTOR LIGHT-EMITTING DEVICE, AND LAMP

(75) Inventors: Hisayuki Miki, Chiba (JP); Kenzo Hanawa, Ichihara (JP); Yasumasa Sasaki, Kamakura (JP)

(73) Assignee: Showa Denko K.K., Tokyo (JP)

( * ) Notice: Subject to any disclaimer, the term of this patent is extended or adjusted under 35 U.S.C. 154(b) by 242 days.

(21) Appl. No.: 12/519,987

(22) PCT Filed: Dec. 18, 2007

(86) PCT No.: PCT/JP2007/074311
§ 371 (c)(1),
(2), (4) Date: Jun. 18, 2009

(87) PCT Pub. No.: WO2008/075679
PCT Pub. Date: Jun. 26, 2008

(65) Prior Publication Data
US 2010/0051980 A1    Mar. 4, 2010

(30) Foreign Application Priority Data
Dec. 20, 2006    (JP) .................................. 2006-343020

(51) Int. Cl.
*H01L 21/20* (2006.01)
(52) U.S. Cl. ..................................... 438/47; 257/E21.09
(58) Field of Classification Search .................... 438/47; 257/E21.09
See application file for complete search history.

(56) References Cited

U.S. PATENT DOCUMENTS

| | | | |
|---|---|---|---|
| 5,122,845 A | 6/1992 | Manabe et al. | |
| 5,290,393 A | 3/1994 | Nakamura | |
| 6,165,812 A | 12/2000 | Ishibashi et al. | |
| 6,475,923 B1 * | 11/2002 | Mitamura | 438/758 |
| 6,713,789 B1 | 3/2004 | Shibata et al. | |
| 2003/0039866 A1 * | 2/2003 | Mitamura | 428/698 |
| 2003/0109076 A1 | 6/2003 | Senda et al. | |
| 2007/0080369 A1 * | 4/2007 | Sakai | 257/103 |

FOREIGN PATENT DOCUMENTS

| | | |
|---|---|---|
| JP | 60173829 A | 9/1985 |
| JP | 4297023 A | 10/1992 |

(Continued)

OTHER PUBLICATIONS

Kazuya Kusaka, et al. "Effect of substrate temperature on crystal orientation and residual stress in radio frequency sputtered gallium-nitride films" J. Vac. Technology, Jul./Aug. 2004 pp. 1587-1590.

(Continued)

*Primary Examiner* — Alexander Ghyka
*Assistant Examiner* — Stanetta Isaac
(74) *Attorney, Agent, or Firm* — Sughrue Mion, PLLC

(57) ABSTRACT

A method for manufacturing a Group III nitride semiconductor light-emitting device according to the present invention, comprising forming, on a substrate, a semiconductor layer comprised of a Group III nitride compound semiconductor containing Ga as a Group III element by a sputtering method, wherein during the formation of the semiconductor layer, sputtering is performed under the condition where at least the surface layer of a sputtering target comprised of Ga is liquefied.

14 Claims, 5 Drawing Sheets

FOREIGN PATENT DOCUMENTS

| | | |
|---|---|---|
| JP | 11-354846 A | 12/1999 |
| JP | 3026087 B2 | 1/2000 |
| JP | 2001-308010 A | 11/2001 |
| JP | 3440873 B2 | 6/2003 |
| JP | 2004-149852 A | 5/2004 |
| JP | 3700492 B2 | 7/2005 |
| JP | 2005-272894 A | 10/2005 |
| JP | 2006-310568 A | 11/2006 |

OTHER PUBLICATIONS

T. Kikuma, et al. "GaN films deposited by planar magnetron sputtering" Vacuum 66, 2002, pp. 233-237.

Y. Ushiku, et al. "21 Century Union Symposium Collected Papers", vol. 2, pp. 295-298, 2003.

M. Ishihara, et al. "Control of preferential orientation of AlN films prepared by the reactive sputtering method", Thin Solid Films 316, pp. 152-157, 1998.

Kikuo Tominaga, et al. "AlN Film Preparation on Glass by Sputtering System with Facing Targets" Japanese Journal of Applied Physics, vol. 28, pp. 7-10 1989.

* cited by examiner

METHOD FOR MANUFACTURING GROUP III NITRIDE COMPOUND SEMICONDUCTOR LIGHT-EMITTING DEVICE, GROUP III NITRIDE COMPOUND SEMICONDUCTOR LIGHT-EMITTING DEVICE, AND LAMP

TECHNICAL FIELD

The present invention relates to a method for manufacturing a Group III nitride compound semiconductor light-emitting device which is suitably used for a light emitting diode (LED), a laser diode (LD), an electronic device, and the like; a Group III nitride compound semiconductor light-emitting device; and a lamp.

Priority is claimed on Japanese Patent Application No. 2006-343020, filed Dec. 20, 2006, the content of which is incorporated herein by reference.

BACKGROUND ART

Group III nitride semiconductor light emitting diodes offer a direct transition over a band gap energy from visible light to ultraviolet rays, and excel in the light emission efficiency, and thus have been used as light-emitting devices such as LED and LD.

In addition, when used for an electronic device, Group III nitride semiconductors have a potential to provide electronic devices having characteristics superior to those using conventional Group III-V compound semiconductors.

Such Group III nitride compound semiconductors are, in general, produced from trimethyl gallium, trimethyl aluminum, and ammonia as raw materials through a Metal Organic Chemical Vapor Deposition (MOCVD) method. The MOCVD method is a method in which a vapor of a raw material is introduced into a carrier gas to convey the vapor to the surface of a substrate and decompose the raw material by the reaction with the heated substrate, to thereby grow a crystal.

Hitherto, a single crystal wafer of a Group III-V compound semiconductor is, in general, produced by growing a crystal on a single crystal wafer of a different material. There is a large lattice mismatching between such a different kind of substrate and a Group III nitride semiconductor crystal to be epitaxially grown thereon. For example, when gallium nitride (GaN) is grown on a sapphire ($Al_2O_3$) substrate, there is a lattice mismatching of 16% therebetween, and when gallium nitride is grown on a SiC substrate, there is a lattice mismatching of 6% therebetween. In general, a large lattice mismatching as in the above leads to a problem in that it is difficult to epitaxially grow a crystal directly on a substrate, or a crystal, even if grown, can not gain excellent crystallinity.

Thus, for epitaxially growing a Group III nitride semiconductor crystal on a single crystal sapphire substrate or a single crystal SiC substrate through a Metal Organic Chemical Vapor Deposition (MOCVD) method, a method has been proposed and generally performed in which, firstly, a layer called a low temperature buffer layer made of aluminum nitride (AlN) or aluminum nitride gallium (AlGaN) is laminated on a substrate, and then a Group III nitride semiconductor crystal is epitaxially grown thereon at a high temperature (for example, Patent Documents 1 and 2).

In addition, there has been proposed a method for forming a film of AlN on a substrate by the system called face-to-face cathodes in which targets are positioned face-to-face (for example, Non-Patent Document 1).

In addition, there has been proposed a method for forming a film of AlN on a substrate by a DC magnetron sputtering method (for example, Non-Patent Document 2).

In addition, regarding a method in which a layer of such as AlN is formed as a barrier layer by a method other than the MOCVD method, and another layer is formed thereon by a MOCVD method, a method has been proposed in which a buffer layer is formed by high frequency sputtering, and a crystal having the same composition is grown thereon by a MOCVD method (for example, Patent Document 3). However, the method disclosed in Patent Document 3 has a problem in that an excellent crystal cannot be stably produced.

Thus, in order to stably produce an excellent crystal, for example, there have been proposed a method for annealing a buffer layer in a mixed gas made of ammonia and hydrogen on completion of its growth (for example, Patent Document 4), and a method for forming a buffer layer by DC sputtering at a temperature of 400° C. or higher (for example, Patent document 5). In the methods described in Patent Documents 4 and 5, a material such as sapphire, silicon, silicon carbide, zinc oxide, gallium phosphide, gallium arsenide, magnesium oxide, manganese oxide, or a Group III nitride type compound semiconductor single crystal is used as a substrate material. Of these, the substrate of the a surface of sapphire is considered to be preferable.

However, a buffer layer is formed by a sputtering method in the methods described in Patent Documents 4 and 5. Therefore, while the film formation rate is high, a buffer layer with poor crystallinity can be formed depending on film formation conditions. When a GaN layer is grown on such buffer layer with poor crystallinity, the crystallinity of the GaN layer is significantly deteriorated.

On the other hand, research has been conducted on the manufacture of a Group III nitride compound semiconductor crystal by sputtering. For example, there has been proposed a method for forming a Ga layer on the (100) surface of Si and the (0001) surface of $Al_2O_3$ by a high-frequency magnetron sputtering using $N_2$ gas has been proposed (for example, Non-Patent Document 3).

In addition, there has been proposed a method for forming a GaN layer on a substrate using an apparatus in which a cathode and a solid target are positioned face-to-face and mesh is provided between a substrate and a target (for example, Non-Patent Document 4).

In addition, there has been proposed a method for forming a GaN layer in which the energy of the provided particles, which are withdrawn from a target and collides to a substrate, is reduced to such a low energy as possible (for example, Non-Patent Document 5).

Patent Document 1: Japanese Patent No. 3026087
Patent Document 2: Japanese Unexamined Patent Application, First Publication No. Hei 4-297023
Patent Document 3: Japanese Examined Patent Application, Second Publication No. Hei 5-86646
Patent Document 4: Japanese Patent No. 3440873
Patent Document 5: Japanese Patent No. 3700492
Non-Patent Document 1: Kikuo Tominaga, et al., "Japanese Journal of Applied Physics", Vol. 28, p 7 (1989)
Non-Patent Document 2: M. Ishihara, et al., "Thin Solid Films", Vol. 316, p 152 (1998)
Non-Patent Document 3: Y. USHIKU, et al. "21 Century Union Symposium Collected Papers", Vol. 2nd, p 295 (2003)
Non-Patent Document 4: T. Kikuma, et al., "Vacuum", Vol. 66, p 233 (2002)
Non-Patent Document 5: Kikuo Tominaga, et al., "Journal of Vacuum Science and Technology", A22, p 1587 (2004)

In the methods described in Non-Patent Documents 3 and 4, when a GaN layer is formed by a sputtering method, a target is cooled by means of water-cooling, etc. so as to be used as a solid target. This is because Ga used as a target is a metal having a low melting point of about 29° C. However, when a GaN layer is formed by a sputtering method using such solid target, the continuous application of a power to a target causes the partially disproportionate reduction of the target. Therefore, there is a problem in that the film formation rate of the GaN layer varies as a function of the target amount.

Moreover, in the method described in Non-Patent document 5, during the formation of a GaN layer by a sputtering method, the sputtering is performed while the energy of the provided particles, which are withdrawn from a target and collides to a substrate, is reduced. Therefore, there is a problem in that a GaN layer with good crystallinity cannot be formed.

Accordingly, when a GaN layer with good crystallinity is stably formed on a substrate by a sputtering method, the particles frying out of the target during the sputtering is desired to be particles with much high energy.

DISCLOSURE OF INVENTION

Problems to be Solved by the Invention

The present invention takes the above problems into consideration, and has an object to provide a method for manufacturing a Group III nitride compound semiconductor light-emitting device with excellent light emission characteristics, which is capable of highly efficiently forming, for a short time, a crystal film made of a Group III nitride compound semiconductor with favorable uniformity, and has good productivity. In addition, the present invention has other objects to provide a Group III nitride semiconductor light-emitting device and a lamp.

Means to Solve the Problems

As a result of intensive studies conducted by the inventors of the present invention for the purpose of solving the aforementioned problems, the following has been revealed. When sputtering is performed by using Ga as a target so as to form a GaN layer on a substrate, by performing the sputtering under the condition where Ga is liquefied, the particles with much higher energy can be withdrawn from the target, and provided onto the substrate. Moreover, the target can be used uniformly. These findings have led to the completion of the present invention.

That is, the present invention relates to the following.
[1] A method for manufacturing a Group III nitride semiconductor light-emitting device, comprising forming, on a substrate, a semiconductor layer comprised of a Group III nitride compound semiconductor containing Ga as a Group III element by a sputtering method, wherein during the formation of the semiconductor layer, sputtering is performed under the condition where at least the surface layer of a sputtering target comprised of Ga is liquefied.
[2] The method for manufacturing a Group III nitride semiconductor light-emitting device according to [1], wherein the sputtering target is liquefied by a power applied to the sputtering target.
[3] The method for manufacturing a Group III nitride semiconductor light-emitting device according to [2], wherein the power applied to the sputtering target is set to 0.02 W/cm$^2$ or more.
[4] The method for manufacturing a Group III nitride semiconductor light-emitting device according to [1], wherein the sputtering target is liquefied by heating.
[5] The method for manufacturing a Group III nitride semiconductor light-emitting device according to any one of [1] through [4], wherein during the formation of the semiconductor layer, a power is applied to the sputtering target by a high-frequency method or a pulsed DC method.
[6] The method for manufacturing a Group III nitride semiconductor light-emitting device according to any one of [1] through [5], wherein during the formation of the semiconductor layer, a magnetic field is rotated or swung for the sputtering target.
[7] The method for manufacturing a Group III nitride semiconductor light-emitting device according to any one of [1] through [6], wherein the semiconductor layer is formed by a reactive sputtering method in which a nitride material is circulated in a reactor.
[8] The method for manufacturing a Group III nitride semiconductor light-emitting device according to [7], wherein nitrogen is used as the nitride material.
[9] The method for manufacturing a Group III nitride semiconductor light-emitting device according to any one of [1] through [8], further comprising forming, by the sputtering method, a buffer layer comprised of a columnar crystal between the substrate and the semiconductor layer.
[10] The method for manufacturing a Group III nitride semiconductor light-emitting device according to [9], wherein the buffer layer is formed of a Group III nitride compound containing Al as a Group III element.
[11] The method for manufacturing a Group III nitride compound semiconductor light-emitting device according to [10], wherein the buffer layer is formed of AlN.
[12] The method for manufacturing a Group III nitride compound semiconductor light-emitting device according to any one of [9] through [11], wherein the buffer layer is formed so as to cover 90% or more of the surface of the substrate.
[13] The method for manufacturing a Group III nitride compound semiconductor light-emitting device according to any one of [9] through [12], wherein the width of a grain of the columnar crystal constituting the buffer layer is within a range of 0.1 to 100 nm.
[14] The method for manufacturing a Group III nitride compound semiconductor light-emitting device according to any one of [9] through [13], wherein the thickness of the buffer layer is within a range of 10 to 500 nm.
[15] The method for manufacturing a Group III nitride compound semiconductor light-emitting device according to any one of [9] through [14], wherein the buffer layer is formed of AlN, and the semiconductor layer comprised of the Group III nitride compound is formed of GaN.
[16] The method for manufacturing a Group III nitride compound semiconductor light-emitting device according to any one of [1] through [15], wherein sapphire is used for the substrate.
[17] A Group III nitride compound semiconductor light-emitting device, which is obtained by the method for manufacturing a Group III nitride semiconductor light-emitting device according to any one of any one of [1] through [16].
[18] A lamp comprising the Group III nitride semiconductor light-emitting device according to [17].

Effect of the Invention

According to the method for manufacturing a Group III nitride compound semiconductor light-emitting device of the present invention, a crystal film made of a Group III nitride compound semiconductor with good uniformity can be formed by a sputtering method for a short time because the method includes the aforementioned features. In addition, the particles with much higher energy can be withdrawn from the target, and provided onto the substrate, and moreover, the target can be used evenly. Therefore, a crystal film made of a Group III nitride compound semiconductor can be formed highly efficiently.

Accordingly, a semiconductor layer made of a Group III nitride compound with good crystallinity can be efficiently grown on the substrate, and a Group III nitride compound semiconductor light-emitting device, which is inexpensive and has good productivity and light emission characteristics, can be obtained.

BRIEF DESCRIPTION OF THE REFERENCE SYMBOLS

Figure 1:
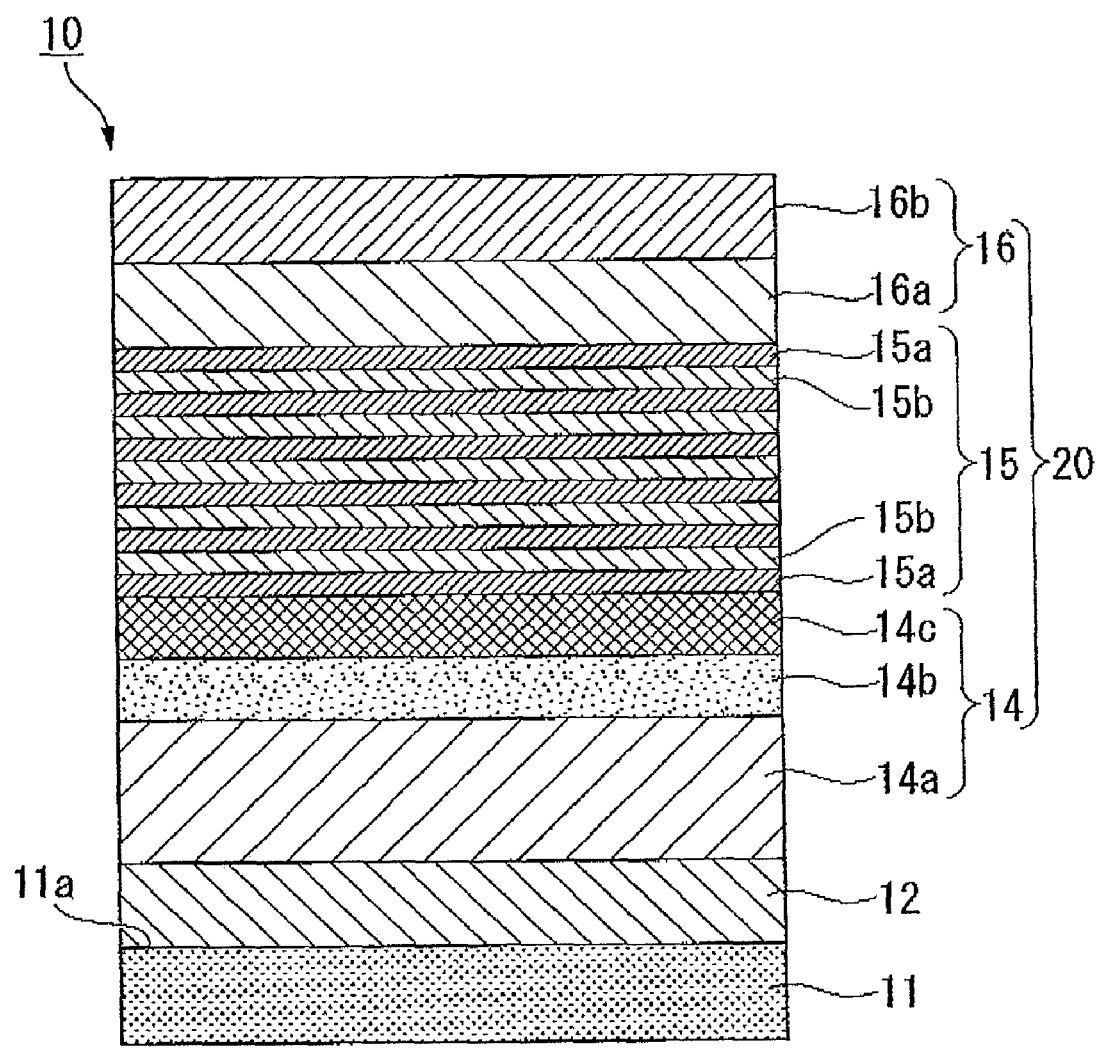
FIG. 1 is a schematic diagram for explaining an example of a Group III nitride compound semiconductor light-emitting device according to the present invention, showing a cross-sectional structure of a laminated semiconductor.

1: Group III nitride compound semiconductor light-emitting device, 10: Laminated semiconductor, 11: Substrate, 11a: Surface, 12: Buffer layer, 13: Ground layer, 14: N-type semiconductor layer, 15: Light-emitting layer, 16: P-type semiconductor layer, 17: Transparent positive electrode, 3: Lamp, 43: Target stage, 47: Sputtering target, 47a: Surface layer

BEST MODE FOR CARRYING OUT THE INVENTION

Hereunder is a description of one embodiment of a method for manufacturing a Group III nitride compound semiconductor light-emitting device, a Group III nitride compound semiconductor light-emitting device, and a lamp according to the present invention, with appropriate reference to FIGS. 1 to 6.

The method for manufacturing a Group III nitride compound semiconductor light-emitting device hereunder may be abbreviated as a light-emitting device) of the present embodiment, the method includes forming, on a substrate 11, a semiconductor layer comprised of a Group III nitride compound semiconductor containing Ga as a Group III element by a sputtering method, wherein during the formation of the semiconductor layer, sputtering is performed under the condition where at least the surface layer of a sputter target comprised of Ga is liquefied.

In the manufacturing method of the present embodiment, when a semiconductor layer comprised of a Group III nitride compound semiconductor is epitaxially grown on a substrate 11 by a sputtering method, sputtering is performed under the condition where at least the surface layer 47a of a sputtering target 47 is liquefied. Therefore, the particles with much higher energy can be withdrawn from the sputtering target 47, and provided onto the substrate 11, and moreover, the sputtering target 47 can be used uniformly without partial bias. For this reason, a Group III nitride compound semiconductor with good crystallinity can be formed stably and highly efficiently on the substrate 11.

The laminated structure of the light-emitting device obtained by a manufacturing method of the present embodiment is described with reference to a laminated semiconductor 10 illustrated in FIG. 1. In the laminated semiconductor 10, on the substrate 11 is laminated a buffer layer 12 made of a Group III nitride compound; and on the buffer layer 12 is formed a semiconductor layer 20 having an n-type semiconductor layer 14, a light-emitting layer 15, and a p-type semiconductor layer 16 sequentially laminated.

Figure 2:
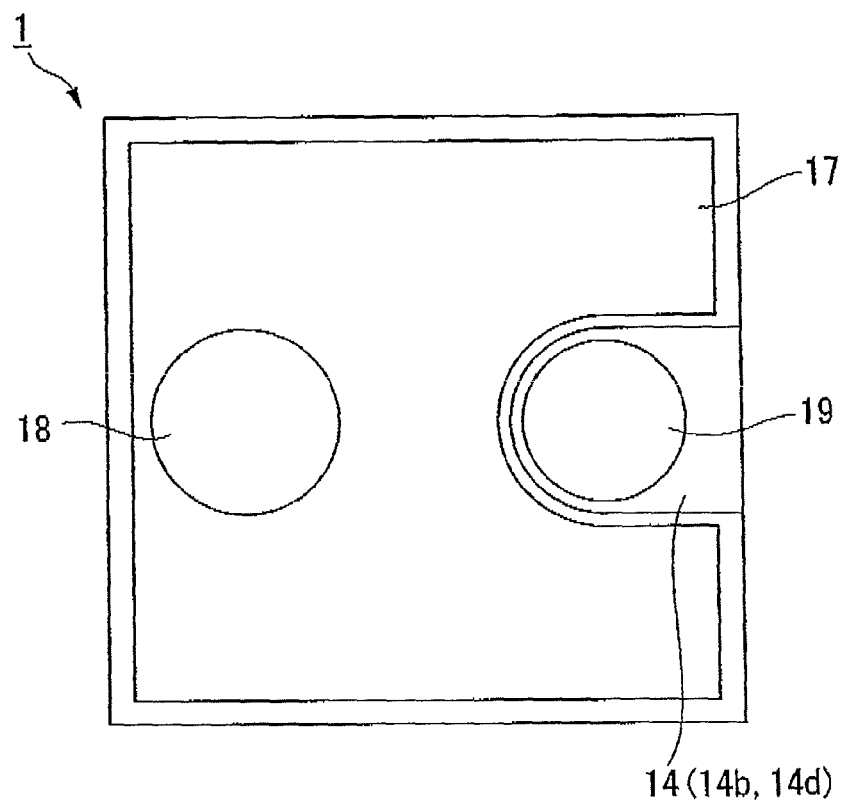
FIG. 2 is a schematic diagram for explaining an example of the Group III nitride compound semiconductor light-emitting device according to the present invention, showing a planar structure thereof.
Figure 3:
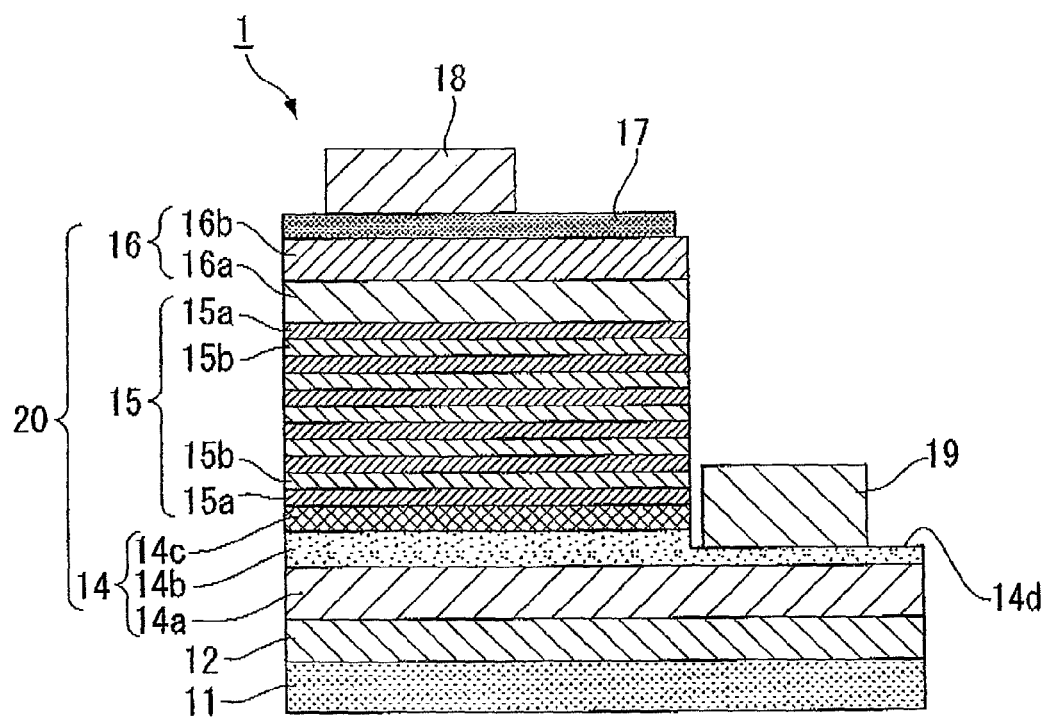
FIG. 3 is a schematic diagram for explaining an example of the Group III nitride compound semiconductor light-emitting device according to the present invention, showing a cross-sectional structure thereof.

Using the laminated semiconductor 10 of the present embodiment as illustrated in FIG. 2 and FIG. 3, it is possible to constitute the light-emitting device 1 comprising a transparent positive electrode 17 laminated on the p-type semiconductor layer 16, a positive electrode bonding pad 18 formed thereon, and a negative electrode 19 laminated on an exposed area 14d that has been formed in the n-type contact layer 14b of the n-type semiconductor layer 14.

Hereunder is a detailed description of a light-emitting device and a method for manufacturing a light-emitting device of the present embodiment.

[Formation of Semiconductor Layer Performed while Liquefying Sputtering Target]

In the method for manufacturing the light emitting device of the present embodiment, as described above, the sputtering is performed under the condition where at least the surface layer 47a of the sputtering target 47 comprised of Ga is liquefied, to thereby form the layers that constitute the semiconductor layer 20 on the substrate 11.

In the present embodiment, the aforementioned sputtering method is used to perform the formation of respective layers of the ground layer 14a and the n-type contact layer 14b that constitute the n-type semiconductor layer 14, and the p-type clad layer 16a and the p-type contact layer 16 that constitute the p-type semiconductor layer 16, with the semiconductor layer 20.

In order that the Group III nitride compound semiconductor with good crystallinity is formed on the substrate by using the sputtering method, reactive species with higher energy need to be produced to activate migration on the substrate. Moreover, in order that atoms are efficiently withdrawn from the metal material used as the sputtering target such as Ga and form a layer on the substrate, the method described in details below is used in the present embodiment.

(Pretreatment of Sputtering Target)

When the target is liquefied and used, there is a possibility that the gas components involved in Ga such as oxygen and nitrogen are released into the chamber 41 during the sputtering process, and have an effect on the film formation process using the sputtering. In order to avoid such effect of the gas components on the sputtering process, the sputtering target 47 is preferably subjected to the pretreatment so as to expedite the degassing when the sputtering target 47 is placed in the chamber 41.

An example of the pretreatment performed for the sputtering target 47 is the method in which the sputtering target 47 is heated to discharge the gas components into gas phase. Another example is the method in which the metal is reduced by flowing hydrogen gas, etc. in the gas phase inside the chamber 47, to thereby remove the impurities.

(Liquefaction of Sputtering Target Comprised of Ga)

In the manufacturing method of the present embodiment during the film formation using the sputtering method, the sputtering target comprised of Ga can be liquefied by applying power onto the sputtering target to generate plasma and to increase the temperature of the sputtering target. Also, the sputtering target comprised of Ga can be liquefied by another method in which the target is heated by providing a heater or a pipe for hot water, etc. around the target.

In the present embodiment, the sputtering target 47 comprised of Ga can be used in a liquid state without cooling. In this case, the whole sputtering target 47 may be in a liquid state, or only the face layer 47a may be in a liquid state.

As described above, Ga is a metal having a low melting point of 29° C. Therefore, in the case where the ambient temperature of the target stage 43 is 29° C. or higher in the sputtering apparatus 40, the sputtering target 47 comprised of Ga becomes in a liquid state. In this case, when power is applied to the sputtering target 47 in a liquid state without cooling so as to perform the sputtering, the particles with high energy can be withdrawn and provided onto the substrate 11, and the metal material that constitutes the sputtering target 47 can be used efficiently.

Meanwhile, in the case where the ambient temperature of the target stage 43 is lower than 29° C. in the sputtering apparatus 40, the sputtering target 47 comprised of Ga becomes in a solid state. Besides, in the case where the target stage 43 is cooled by a method such as water-cooling so that the sputtering target 47 is cooled to have a temperature of lower than 29° C., the sputtering target 47 comprised of Ga becomes in a solid state. In this case, when the power that is applied to the sputtering target 47 is adjusted to a certain value or more, at least the surface layer 47a or the whole of the sputtering target 47 can be liquefied, and the sputtering can be performed in this condition.

In the aforementioned case, the power that is applied to the sputtering target 47 is preferably adjusted to 0.02 W/cm$^2$ or higher. By applying the power of 0.02 W/cm$^2$ or higher to the sputtering target, the liquefaction is certainly completed even when the sputtering target is in a solid state because the surface layer 47a of the sputtering target 47 is exposed to plasma and melted.

When the power that is applied to the sputtering target 47 is lower than 0.02 W/cm$^2$, the sputtering target 47 in a solid state cannot be liquefied, and the sputtering is performed in a solid state. As a result, there are possibilities that the particles withdrawn from the sputtering target 47 do not have high energy and that the usability of the sputtering target 47 is deteriorated.

In addition, the temperature of the sputtering target 47 increases by the heat generated during the heating of the substrate 11. As long as the sputtering target 47 is heated to have a temperature of 29° C. or higher at this time, the sputtering target 47 can be liquefied even when the power that is applied to the sputtering target 47 is lower than the aforementioned range. However, in case the temperature of the sputtering target 47 does not reach the temperature for the liquefaction, a heating device for heating the sputtering target (which is not illustrated in FIG.) may be provided in the chamber 21. A heating device used in this case is not particularly limited, and an electrothermal heater, etc. can be appropriately selected and used.

As described above, a GaN layer has been conventionally formed while the energy of particles withdrawn from a sputtering target is as lowered as possible (see Non-Patent Document 5).

However, the present inventors conducted the intensive research and found that it is preferable that the energy of particles withdrawn from a target be as raised as possible in order to efficiently form a GaN layer with good crystallinity. Also, the present inventors found that sputtering of a target in a liquid state enables to withdraw particles with high energy from the target.

(Formation of Semiconductor Layer)

In the manufacturing method of the present embodiment, preferable examples of a sputtering method used to form the semiconductor layer include an RF (radio-frequency) sputtering method and a DC sputtering method, and it is preferable that power be applied to the sputtering target by using the aforementioned sputtering method.

When the reactive sputtering method described below is used, an RF sputtering method is preferably used because the film formation rate can be controlled easily.

When a reactive sputtering method is used with a DC sputtering method, a sputtering target is charged up under the condition where a DC electric field is continuously applied, and the film formation rate is difficult to increase. Therefore, it is preferable to use a pulse-type DC sputtering method that applies a pulsed bias.

When the semiconductor layer is formed by the sputtering method, it is preferable to use the reactive sputtering method in which a raw material of a nitride is flowed into the reactor because the good crystallinity can be maintained by controlling the reaction and the good crystallinity can be stably reproduced.

In the present embodiment, it is preferable to rotate or swing the magnetic field with respect to the sputtering target 47 when the semiconductor layer is formed by a sputtering method.

Particularly when an RF sputtering is used, as a method for obtaining a uniform thickness, it is preferable that the film formation be performed while the position of a magnet is moved within the target (sputtering target). The specific movement of a magnet is appropriately selected depending on a type of a sputtering apparatus. For example, the magnet can be swung or rotated.

Figure 5:
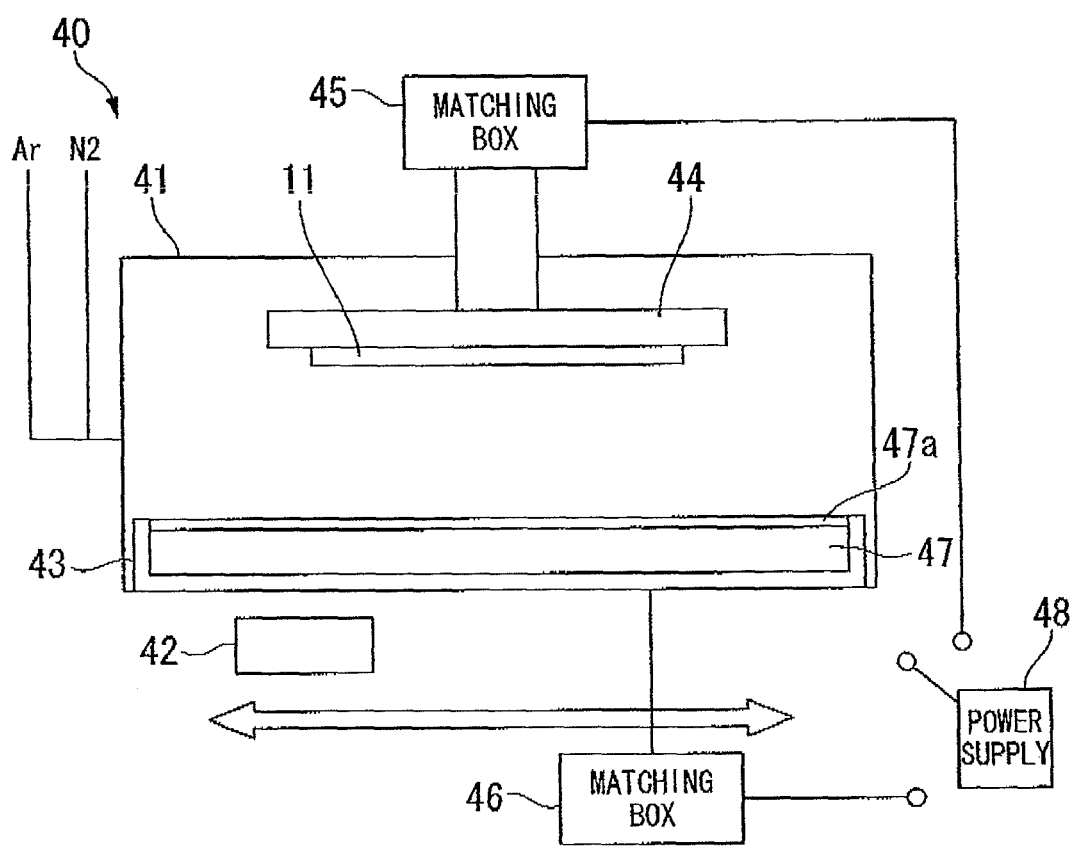
FIG. 5 is a schematic diagram for explaining an example of a method for manufacturing a Group III nitride compound semiconductor light-emitting device according to the present invention, showing a structure of a sputtering apparatus with a swing method.

In the sputtering apparatus 40 illustrated in FIG. 5, the magnet 42 is placed below the target stage 43 that holds the sputtering target 47 comprised of the metal of Ga (at lower part of FIG. 5). The magnet 42 is swung by a drive unit (which is not illustrated in FIG.) along the target stage 43 below the sputtering target 47, to thereby apply power to the sputtering target 47. At that time, a nitrogen gas and an argon gas are flowed in the chamber 41.

Then, the surface layer 47a of the sputtering target 47 is exposed to the plasma of the argon gas and the nitrogen gas, and melted to be in a liquid state. From this surface layer 47a in a liquid state, the particles with high energy are withdrawn. These particles are provided so as to collide with the surface 11a of the substrate 11 attached to the heater 44, and thus, the semiconductor layer is formed by the sputtering method on the substrate 11.

In the sputtering apparatus 50 illustrated in FIG. 6, the elliptical magnet 52 is placed below the sputtering target 47

Figure 6:
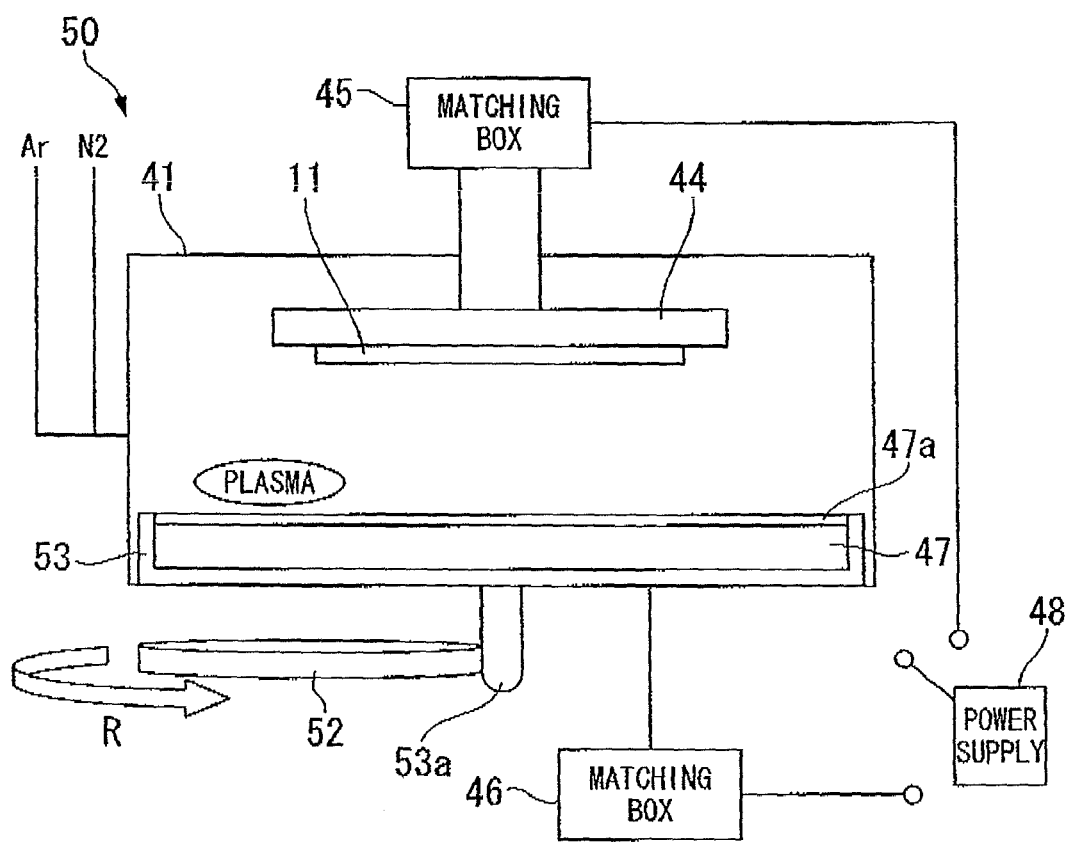
FIG. 6 is a schematic diagram for explaining an example of a method for manufacturing a Group III nitride compound semiconductor light-emitting device according to the present invention, showing a structure of a sputtering apparatus with a rotating method.

(at lower part of FIG. 6). This magnet 52 revolves, below the sputtering target 47, around the rotation axis that is the central axis 53a of the circular target stage 53 that holds the sputtering target 47 (in the direction of the arrow R in FIG. 6).

At this time, the magnet 52 traps the plasma within the magnetic field generated by the magnet 52, and revolves below the sputtering target 47. Therefore, the plasma also revolves on the surface of the sputtering target 47. This action is combined with the action of the liquefied surface layer 47a of the sputtering target 47, which results in the even use of the sputtering target 47 with higher efficiency. Moreover, it is possible to prevent the surface of the sputtering target 47 from being covered with the reaction product. Thus, there is the advantage in that the sputtering particles are withdrawn from the sputtering target 47 to the substrate 11 in various directions and efficiently adhere to the substrate 11.

Herein, the pressure inside the chamber 41 during the formation of the semiconductor layer 20 using the sputtering method is preferably 0.3 Pa or higher. When the pressure inside the chamber 41 is lower than 0.3 Pa, there is a possibility that the sputtered metal adheres onto the substrate 11 without producing nitrides because the abundance of the nitrogen is too small. The upper limit of the pressure inside the chamber 41 is not particularly limited, but should be suppressed to the pressure at which plasma can be generated.

As a raw material of the nitride used in the present embodiment, a generally known nitrogen compound can be used without any limitation, and ammonia and nitrogen ($N_2$) are preferred because they are easy to handle and relatively inexpensive to purchase.

Ammonia has good decomposition efficiency, and can be used for a film formation at a high growth rate. However, because ammonia is highly reactive and toxic, a detoxifying apparatus and a gas detector are required, and the materials of members used in a reaction apparatus need to have high chemical stability. When nitrogen ($N_2$) is used as a raw material, a simple apparatus can be used, but a high reaction rate cannot be obtained. However, when nitrogen is used after the decomposition due to an electric field or heat, etc., the film formation rate that is enough for industrial manufacturing can be obtained although being lower than that of ammonia. Therefore, nitrogen is the most preferable nitrogen source in view of the balance with the cost of an apparatus.

The film formation rate during the film formation using the sputtering method is preferably within the range from 0.01 nm/s to 10 nm/s. When the film formation rate is lower than 0.01 nm/s, the film formation process takes long time, and large unproductiveness occurs in industrial manufacturing. When the film formation rate is higher than 10 nm/s, it is difficult to obtain a good film.

The substrate 11 used in the present embodiment is preferably subjected to the wet-type pretreatment. For example, the substrate 11 formed of silicon is subjected to a known RCA washing method, and the surface thereof is hydrogen-terminated, to thereby stabilize the film formation process.

Also, the pretreatment can be performed by using the sputtering method, etc. after the substrate is introduced into the reactor (the chamber 41 of the sputtering apparatus 40) before the buffer layer 12 is formed on the substrate 11.

In specific, the surface can be arranged by exposing the substrate 11 to the plasma of Ar or $N_2$. For example, organic matters or oxides can be removed by subjecting the surface of the substrate 11 to the plasma of an Ar gas or $N_2$ gas, etc. At that time, the plasma particles can efficiently affect the substrate 11 by applying voltage between the substrate 11 and the chamber.

The present inventors conducted the intensive research and the experiments, and found that the temperature of the substrate 11 during the formation of the semiconductor layer is preferably within the range from room temperature to 1,200° C., more preferably from 300° C. to 1,000° C., and most preferably from 500° C. to 800° C.

When the temperature of the substrate 11 is lower than the aforementioned lower limit, the migration on the substrate 11 is suppressed, and the film of the Group III nitride compound semiconductor crystal with good crystallinity cannot be formed. When the temperature of the substrate 11 is higher than the aforementioned upper limit, there is a possibility that the Group III nitride compound semiconductor crystal is decomposed.

The room temperature described in the present invention depends on the circumstances of the respective steps, etc., and the specific temperature is within the range from 0° C. to 30° C.

When mixed crystal is formed by the sputtering method, a mixture of metal materials (which does not necessarily form an alloy) can be used as a target. Other than this method, it is possible to use another method in which targets of different materials are prepared, and sputtering is simultaneously performed. For example, in the case of the formation of a film that has a certain composition, a target of mixed materials is used. In the case of the formation of several kinds of films that have different compositions, several targets are placed in the chamber.

(Film Formation of 3-Element and 4-Element Nitrides)

In the manufacturing method of the present embodiment, Ga that constitutes the sputtering target 47 can be mixed with the metal elements such as Al and In, to thereby form films of 3-element and 4-element nitrides. These metals have high affinity with Ga, and can be easily melted. Therefore, a crystal film with an even composition can be formed with good reproducibility. However, when the element that cannot be melted in Ga is used as a liquefied target, vertical distribution occurs due to the difference of specific gravities. Therefore, such element is not appropriate in the method in which Ga is mixed with other elements in a target.

Other than the method in which Ga that constitutes the sputtering target 47 is mixed with the metal elements such as Al and In, it is possible to use another method in which the targets of metal elements that are used to form a mixed crystal are separately prepared and sputtering is simultaneously performed.

(Doping Method)

In the manufacturing method of the present embodiment, it is possible to use a method in which a dopant is mixed in a target and sputtering is performed. Examples of a dopant used in a nitride semiconductor include Si, Ge, Sn, Mg, Zn, and Be, and the mixture thereof can be used. However there is a limitation to the concentration of a dopant at which a dopant can be melt in the sputtering target.

When it is difficult to melt a necessary amount of a dopant in the sputtering target, it is possible to use a method in which another target formed of a dopant is placed in the chamber and the sputtering is simultaneously performed. In this case, a doping method is not limited to a sputtering method, and it is possible to use a method in which target formed of a dopant is excited using an ion beam, a laser, or an electron gun, to thereby withdraw an atom. It is also possible to use another method in which a dopant is evaporated by heating using Knudsen Cell, etc. In addition, it is possible to use another method in which a hydride gas is flowed in the gas phase inside the chamber 41 and decomposed near the substrate 11, to thereby provide a dopant.

In the manufacturing method of the present embodiment, the sputtering method is used under the aforementioned conditions to form the ground layer 14a and the n-type contact layer 14b that constitute the N-type semiconductor layer 14, and the p-type clad layer 16a and the p-type contact layer 16b that constitute the p-type semiconductor layer 16, with the semiconductor layer 20. In other words, when the sputtering is performed using the sputtering target 47 comprised of Ga to thereby form the semiconductor layer formed of GaN on the substrate 11, the sputtering target 47 comprised of Ga is used in a liquid state in the present embodiment. Therefore, the particles with much higher energy can be withdrawn from the target, and provided onto the substrate, which enables the formation of the semiconductor layer formed of a Group III nitride compound with good crystallinity. Moreover, because the sputtering target 47 comprised of Ga is used in a liquid state, the target can be used evenly, and Ga of the target material can be used highly efficiently.

In a conventional method in which a sputtering target is used in a solid state during the formation of a semiconductor layer using a sputtering method, as described above, a sputtering target is used unevenly, and a sputtering target is deformed into a wave shape. In that case, the contrasting density of plasma generated during sputtering occurs in a chamber, and therefore, it is necessary to change the conditions for generating plasma in a sputtering process.

According to the manufacturing method of the present embodiment, because the sputtering is performed using the sputtering target in a liquid state as described above, the target can be used evenly. Therefore, it is unnecessary to change the conditions for generating plasma in a sputtering process. As a result, the adjustment of the conditions is not complicated, and the semiconductor layer can be formed on the substrate with high efficiency.

[Laminated Structure of Light-Emitting Device]

Hereunder is a detailed description of the configuration of the light-emitting device 1 obtained by the manufacturing method of the present embodiment in which, as described above, the sputtering is performed under the condition where at least the surface layer 47a of the sputtering target 47 comprised of Ga is liquefied, to thereby form, on the substrate 11, the semiconductor layer of a Group III nitride compound semiconductor that includes Ga as a Group III element.

<Substrate>

As a material which can be used for the substrate 11 in present embodiment, any substrate material on the surface of which a Group III nitride compound semiconductor crystal can epitaxially grow, can be used by selecting from various materials without particular limitations. Examples thereof include sapphire, SiC, silicon, zinc oxide, magnesium oxide, manganese oxide, zirconium oxide, manganese oxide zinc iron, magnesium oxide aluminum, zirconium borate, gallium oxides indium oxide, lithium oxide gallium, lithium oxide aluminum, neodymium oxide gallium, lantern oxide strontium aluminum tantalum, strontium oxide titanium, titanium oxide, hafnium, tungsten, and molybdenum.

Among the abovementioned substrate materials, some oxide substrates and metal substrates are known to cause chemical decomposition by being contacted with ammonia at a high temperature. If such an oxide substrate or a metal substrate is used, it is effective to form a buffer layer without using ammonia and to form a ground layer which constitutes an n-type semiconductor layer, which will be described later, with ammonia, in terms of prevention of such chemical decomposition of the substrate because the buffer layer described in detail below acts as a coat layer.

In addition, in general, the temperature of the substrate can be kept low in a sputtering method. Hence, even if a substrate made of a material decomposable at high temperatures is used, each layer can be formed on the substrate without damaging the substrate 11.

<Buffer Layer>

In the laminated semiconductor 10 of the present embodiment, the buffer layer 12 made of a Group III nitride compound is formed on the substrate 11. The buffer layer 12 is formed as a layer having the purpose for protecting the substrate 11 from the chemical reaction at high temperature, reducing the difference of the lattice constants between the material of the substrate 11 and a semiconductor layer 20 described below, or expediting nucleation for crystal growth.

The buffer layer 12 is preferably formed so as to cover 60% or more of the surface 11a of the substrate 11, more preferably 90% or more, and most preferably 100%, i.e. to cover the surface 11a of the substrate 11 without any void. When the space where the buffer layer 12 covers the surface 11a of the substrate 11 is reduced, the substrate 11 is largely exposed, and a hillock or pit occurs.

Moreover, the buffer layer 12 may be formed so as to cover the surface 11a of the substrate 11 as well as the lateral faces thereof. In addition, the buffer layer 12 may be formed so as to cover the rear face of the substrate 11.

The buffer layer 12 is preferably formed of the aggregate of the columnar crystals in terms of the buffer function. Moreover, the average value of the widths of the respective grains of the columnar crystals is preferably within a range of 0.1 to 100 nm in terms of the buffer function, and more preferably within a range of 1 to 70 nm.

The crystal of the Group III nitride compound semiconductor has a crystal structure of hexagonal system and is likely to form an aggregate structure that is basically a hexagonal column. In particular, the film, which is formed by the film formation method that uses a plasma-treated metal material, is likely to form a columnar crystal. When the buffer layer 12 made of such a columnar crystal is formed on the substrate 11, the buffer function of the buffer layer 12 effectively works. Therefore, the layer of the Group III nitride compound semiconductor formed thereon will become a crystal film having excellent crystallinity.

The columnar crystal described in the present invention refers to a crystal in which adjacent crystal grains are separated since grain boundaries are formed therebetween, and the crystal itself is in a columnar shape in a longitudinal section. Also, the width of the aforementioned grain refers to the distance between boundary faces of crystals when the buffer layer 12 is the aggregate of columnar grains, or the length of the largest gap between the faces through which the crystal grain contacts the substrate surface when the grains are dotted in an island shape.

The thickness of the buffer layer 12 is preferably within a range of 10 to 500 nm, and are preferably within a range of 20 to 100 nm.

If the thickness of the buffer layer 12 is less than 10 nm, the abovementioned buffering function may become insufficient. In addition, if the buffer layer 12 is formed with a thickness of more than 500 nm, it may take a longer time to form the layer although the function as a buffer layer remains unchanged, which may lower the productivity.

The buffer layer 12 preferably has an Al-containing composition, and particularly preferably has a composition of AlN.

Also, as materials constituting the buffer layer 12, any Group III nitride compound semiconductor material represented by the general formula AlGaInN may be used. Furthermore, As or P may also be contained as a group V element.

When the buffer layer 12 has an Al-containing composition, then in particular, the composition is preferably GaAlN. In such a case, the composition preferably contains Al at 50% or more.

In addition, more preferably, the buffer layer 12 is made of AlN because an aggregate structure of a columnar crystal can be formed with efficiency.

<Semiconductor Layer>

As illustrated in FIG. 1, in the laminated semiconductor 10 of the present embodiment, a semiconductor layer 20, which is composed of a nitride-based compound semiconductor and comprises the n-type semiconductor layer 14, the light-emitting layer 15, and the p-type semiconductor layer 16, is laminated on the substrate 11 through a buffer layer 12.

In the n-type semiconductor layer 14, a ground layer 14a and n-type contact layer 14b, which are composed of the Group III nitride compound semiconductor, are provided, and the ground layer 14a is laminated on the buffer layer 12.

On the ground layer 14a made of the Group III nitride compound semiconductor, the crystal lamination structure having such a function as the lamination semiconductor 10 illustrated in FIG. 1 can be laminated as described above. For example, in the case of the formation of the semiconductor lamination structure for a light-emitting device, there can be laminated the n-type conductive layer in which an n-type dopant such as Si, Ge, or Sn is doped, and the p-type conductive layer in which a p-type dopant such as magnesium. Also, as a material, InGa can be used for the light-emitting layer, and AlGaN can be used for the clad layer. In this manner, by forming the Group III nitride semiconductor crystal layer, to which another function is imparted, on the ground layer 14a, the wafer having the semiconductor lamination structure can be produced, which is used for the production of a light-emitting device, a laser diode, or an electronic device, etc.

As the Group III nitride compound semiconductor, a variety of gallium nitride-based compound semiconductors such as those represented by the general formula $Al_xGa_yIn_zN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$) are known. In the present invention, any gallium nitride-based compound semiconductor represented by the general formula $Al_xGa_yIn_zN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$), including these known gallium nitride-based compound semiconductors, may be employed without any limitations.

The gallium nitride-based compound semiconductor may contain any other Group III element other than Al, Ga, and In, and may also contain, if necessary, an element such as Ge, Si, Mg, Ca, Zn, Be, P, As and B. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[N-Type Semiconductor Layer]

The n-type semiconductor layer 14 is usually laminated on the buffer layer 12, and made of the ground layer 14a, an n-type contact layer 14b, and an n-type clad layer 14c. It should be noted that the n-type contact layer may function as a ground layer and/or at n-type clad layer, whereas the ground layer may also function as an n-type contact layer and/or an n-type clad layer.

(Ground Layer)

The ground layer 14a of the present embodiment is made of a Group III nitride compound semiconductor.

It is not always necessary for the material of the ground layer 14a to be the same as that of the buffer layer 12 formed on the substrate 11, and different materials may be used; however, the ground layer 14a is preferably composed of an $Al_xGa_{1-x}N$ layer ($0 \leq x \leq 1$, preferably $0 \leq x \leq 0.5$, and more preferably $0 \leq x \leq 0.1$).

According to the experiment of the present inventors, it is found that a Ga-containing Group III nitride compound, i.e. a GaN-based compound semiconductor, be preferred as the material used for the ground layer 14a.

As required, the ground layer 14a may be doped with an n-type impurity within a range of $1 \times 10^{17}$ to $1 \times 10^{19}/cm^3$, or undoped ($<1 \times 10^{17}/cm^3$), although it is preferably undoped in terms of maintenance of excellent crystallinity.

If the substrate 11 is electrically conductive, electrodes can be formed on and below the light-emitting device by doping a dopant into the ground layer 14a to make it electrically conductive. On the other hand, if an insulating material is used for the substrate 11, a chip structure is taken in which a positive electrode and a negative electrode are both disposed on the same surface of the light-emitting device. Hence, the ground layer 14a is preferably an undoped crystal for better crystallinity. The type of the n-type impurity is not particularly limited. Examples thereof include Si, Ge, and Sn, and preferably Si and Ge.

(N-Type Contact Layer)

The n-type contact layer 14b of the present embodiment is made of a Group III nitride compound semiconductor.

The n-type contact layer 14b is preferably composed of an $Al_xGa_{1-x}N$ layer ($0 \leq x \leq 1$, preferably $0 \leq x \leq 0.5$, and more preferably $0 \leq x \leq 0.1$), similarly to the ground layer 14a. In addition, an n-type impurity is preferably doped therein. The n-type impurity is preferably contained at a concentration of $1 \times 10^{17}$ to $1 \times 10^{19}/cm^3$, and preferably $1 \times 10^{18}$ to $1 \times 10^{19}/cm^3$, in terms of maintenance of excellent ohmic contact with the negative electrode, prevention against cracking, and maintenance of excellent crystallinity. The type of the n-type impurity is not particularly limited. Examples thereof include Si, Ge, and Sn, and preferably Si and Ge. In addition, as described above, the n-type contact layer 14b may also function as a ground layer.

The gallium nitride-based compound semiconductors respectively constituting the ground layer 14a and the n-type contact layer 14b preferably have the same composition. Preferably, the total thickness of these layers is set within a range of 0.1 to 20 μm, preferably 0.5 to 15 μm, and more preferably 1 to 12 μm. If the total thickness is within such a range, the crystallinity of the semiconductor can be kept excellent.

(N-Type Clad Layer)

The n-type clad layer 14c is preferably provided between the abovementioned n-type contact layer 14b and the light-emitting layer 15 described below. To the n-type clad layer 14c, the effects such as electron donation toward the light-emitting layer 15 described below and reduction of the difference of the lattice constants can be imparted. The n-type clad layer 14c can be formed of AlGaN, GaN, GaInN, or the like. In addition, the n-type clad layer 14c may also take a heterojunction of the structures thereof or a superlattice structure formed by multiple laminations of the structures thereof. When the n-type clad layer 14c is formed of GaInN, it is needless to say that the band gap of the n-type clad layer 14c is desirably greater than that of the GaInN of the light-emitting layer 15 in terms of the prevention of reabsorption of the emission.

The concentration of an n-type dopant in the n-type clad layer 14c is preferably within a range of $1\times10^{17}$ to $1\times10^{20}/\text{cm}^3$, and more preferably $1\times10^{18}$ to $1\times10^{19}/\text{cm}^3$. The dopant concentration is preferably within this range in terms of maintenance of excellent crystallinity and reduction of the operating voltage of the light-emitting device.

[P-Type Semiconductor Layer]

The p-type semiconductor layer 16 is normally composed of a p-type clad layer 16a and p-type contact layer 16b. In addition, the p-type contact layer may also function as the p-type clad layer.

(P-Type Clad Layer)

The p-type clad layer 16a is not particularly limited as long as the composition allows a greater band gap energy than that of the light-emitting layer 15, details of which will be described later, and carrier confinement in the light-emitting layer 15 can be achieved, although $Al_dGa_{1-d}N$ ($0<d\leq0.4$, and preferably $0.1\leq d\leq0.3$) is preferred. The p-type clad layer 16a is preferably composed of such AlGaN in terms of carrier confinement in the light-emitting layer 15.

The p-type dopant concentration of the p-type clad layer 16a is preferably set within a range of $1\times10^{18}$ to $1\times10^{21}/\text{cm}^3$, and more preferably $1\times10^{19}$ to $1\times10^{20}/\text{cm}^3$. If the p-type dopant concentration is within the above range, an excellent p-type crystal can be obtained without lowering the crystallinity.

(P-Type Contact Layer)

The p-type contact layer 16b is a gallium nitride-based compound semiconductor layer containing at least $Al_eGa_{1-e}N$ ($0\leq e<0.5$, preferably $0\leq e\leq0.2$, and more preferably $0\leq e\leq0.1$). The Al composition is preferably within the above range in terms of maintenance of excellent crystallinity and excellent ohmic contact with the p-ohmic electrode (refer to a transparent electrode 17 that will be described later).

In addition, the p-type dopant is preferably contained at a concentration within a range of $1\times10^{18}$ to $1\times10^{21}/\text{cm}^3$, and more preferably $5\times10^{19}$ to $5\times10^{20}/\text{cm}^3$, in terms of maintenance of excellent ohmic contact, prevention against cracking, and maintenance of excellent crystallinity.

The type of the p-type impurity is not particularly limited, although Mg is preferably exemplified.

[Light-Emitting Layer]

The light emitting layer 15 is a layer which is laminated on the n-type semiconductor layer 14, as well as being a layer on which the p-type semiconductor layer 16 is laminated. The light emitting layer 15 takes the respective structures such as a multiple quantum well structure, a single well structure, and a bulk structure, etc.

In the example illustrated in FIG. 1, the light emitting layer 15 takes the multiple quantum well structure in which six barrier layers 15a and five well layers 15b are alternately laminated, the barrier layers 15a are provided as the outmost layer and the undermost layer of the light-emitting layer 15, and the well layers 15b are provided between the respective barrier layers 15a.

As the barrier layer 15a, for example, a gallium nitride-based compound semiconductor whose band gap energy is greater than that of the well layer 15b is made of an indium-containing gallium nitride-based compound semiconductor is preferably used.

In addition, for the well layer 15b, for example, a gallium nitride indium such as $Ga_{1-s}In_sN$ ($0<s<0.4$) can be used as the indium-containing gallium nitride-based compound semiconductor.

<Transparent Positive Electrode>

The transparent positive electrode 17 is a transparent electrode formed on the p-type semiconductor layer 16 (p-type contact layer 16b) of the laminated semiconductor 10 as produced above.

The material of the transparent positive electrode 17 is not particularly limited, and materials such as ITO ($In_2O_3$—$SnO_2$), AZO ($ZnO$—$Al_2O_3$), IZO ($In_2O_3$—$ZnO$), and GZO ($ZnO$—$Ga_2O_3$) can be used through a commonly used means which is well known in this technological field. In addition, the structure thereof may employ any structure including conventionally well known structures without any limitations.

The transparent positive electrode 17 may be either formed to cover substantially all over the surface of the Mg-doped p-type semiconductor layer 16 or formed in a lattice shape or branching shape by having spaces. After the formation of the transparent positive electrode 17, thermal annealing for the purpose of alloying or transparent finishing may be either applied or not applied.

<Positive Electrode Bonding Pad and Negative Electrode>

The positive electrode bonding pad 18 is an electrode formed on the abovementioned transparent positive electrode 17.

As the material of the positive electrode 18, Au, Al, Ni, Cu, and the like are exemplified, and various structures using those material are well known. These well known materials and structures may be employed without any limitation.

The thickness of the positive electrode bonding pad 18 is preferably within a range of 100 to 1000 nm. Moreover, in terms of the characteristics of the bonding pad, the thickness is preferably larger since the bondability becomes higher. Therefore, the thickness of the positive electrode bonding pad 18 is more preferably 300 nm or more. Furthermore, the thickness is preferably 500 nm or less in terms of the production cost.

The negative electrode 19 is formed to be in contact with the n-type contact layer 14b of the n-type semiconductor layer 14, in the semiconductor layer in which the n-type semiconductor layer 14, the light-emitting layer 15, and the p-type semiconductor layer 16 have been sequentially laminated on the substrate 11.

Therefore, for forming the negative electrode 19, the p-type semiconductor layer 16, the light-emitting layer 15, and the n-type semiconductor layer 14 are partially removed to thereby expose the exposed area 14d in the n-type contact layer 14b, on which the negative electrode 19 is formed.

As the material of the negative electrode 19, negative electrodes of various compositions and structures are well known. These well known negative electrodes may be employed without any limitation, and can be provided through a commonly used means which is well known in this technical field.

As described above, according to the method for manufacturing a Group III nitride compound semiconductor light-emitting device of the present embodiment, a crystal film made of a Group III nitride compound semiconductor with favorable uniformity can be stably formed for a short time because in the method, the sputtering is performed under the condition where at least the surface layer 47a of a sputtering target 47 is liquefied. In addition, the particles with much higher energy can be withdrawn from the sputtering target 47, and provided onto the substrate 11, and moreover, the sputtering target 47 can be used uniformly. Therefore, a crystal film made of a Group III nitride compound semiconductor can be formed highly efficiently.

Accordingly, a semiconductor layer 20 made of a Group III nitride compound with good crystallinity can be efficiently grown on the substrate 11, and a Group III nitride compound semiconductor light-emitting device, which is inexpensive and has good productivity and light emission characteristics, can be obtained.

In the manufacturing method of the present embodiment, the sputtering is performed under the aforementioned conditions using the sputtering target 47 comprised of Ga, and during the formation of the semiconductor layer made of GaN on the substrate 11, the sputtering target 47 comprised of Ga is used in a liquid state. Therefore, the particles with much higher energy can be withdrawn from the target, and provided onto the substrate. For this reason, the semiconductor layer made of a Group III nitride compound with good crystallinity can be formed.

Also, because the sputtering target 47 comprised of Ga is used in a liquid state, the sputtering target 47 can be used uniformly without partial bias. Therefore, Ga in the sputtering material can be highly efficiently used.

In addition, the present embodiment is the method for forming the semiconductor layer using a sputtering method, the film formation rate can be increased, and the film formation (production) time can be reduced.

Therefore, a Group III nitride compound semiconductor light-emitting device having good productivity and light emission characteristics can be obtained.

[Lamp]

A lamp can be constituted through means well known to those skilled in the art by combining the Group III nitride compound semiconductor light-emitting device of the present invention as explained above with a phosphor. Hitherto, a technique of changing emission colors by combining a light-emitting device with phosphors has been known, and such techniques can be employed without any limitations.

For example, it becomes possible to emit light having a wavelength longer than that of a light-emitting device by properly selecting a phosphor, and further, it is also possible to provide a lamp which can emit white light by mixing a light emitting wavelength of the light-emitting device itself and a wavelength converted by a phosphor.

Moreover, the lamp may be used for any application, such as a bullet shape type for general use, a side view type for use in a back light of a mobile phone, and a top view type for use in an indicator.

Figure 4:
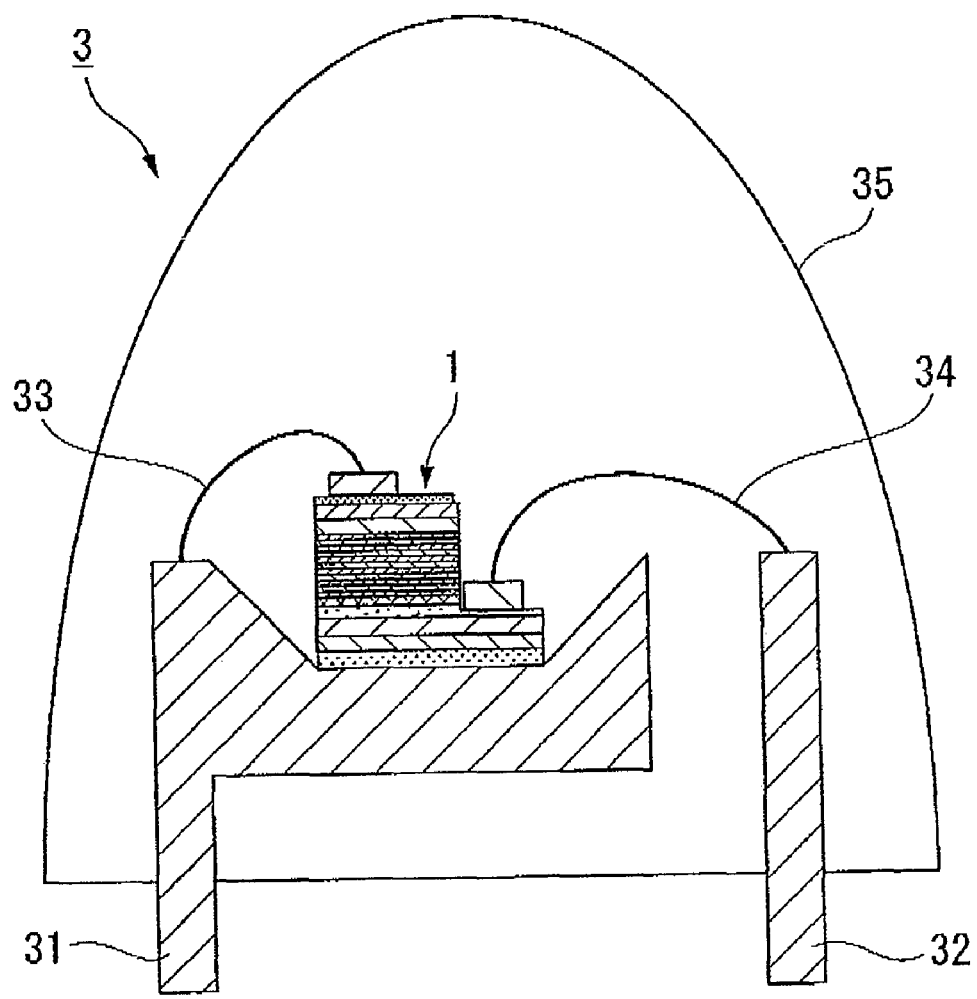
FIG. 4 is a schematic diagram for explaining a lamp constituted by using the Group III nitride compound semiconductor light-emitting device according to the present invention.

For example, as in the example shown in FIG. 4, when the Group III nitride compound semiconductor light-emitting device 1 of a type having electrodes on the same surface is to be mounted in a bullet shape: the light-emitting device 1 is bonded to either one of two frames (frame 31 in FIG. 4); a negative electrode of the light-emitting device 1 (refer to reference symbol 19 shown in FIG. 3) is connected to the frame 32 through a wire 34; and a positive electrode bonding pad of the light-emitting device 1 (refer to reference symbol 18 shown in FIG. 3) is connected to the frame 31 through a wire 33. Then, the surroundings of the light-emitting device 1 are molded with a mold 35 made of a transparent resin. By so doing, the bullet-shaped lamp 3 as illustrated in FIG. 4 can be produced.

In addition, the Group III nitride compound semiconductor light-emitting device according to the present invention can be used for photoelectricity conversion devices such as a laser device and a photo acceptance device, or electronic devices such as HBT (Heterojunction Bipolar Transistor) and HEMT (High Electron Mobility Transistor), besides the abovementioned light-emitting device. Many various structures are known for these semiconductor devices, and the device structure of the laminated structure of the Group III nitride compound semiconductor light-emitting device according to the present invention includes such well known device structures and is not limited at all.

EXAMPLES

Next is a more detailed description of the method for manufacturing a Group III nitride semiconductor compound light-emitting device of the present invention, with reference to Examples. It should be noted that the present invention is not to be limited to these examples.

Example 1

FIG. 1 illustrates the cross-sectional schematic diagram of the laminated semiconductor of the Group III nitride compound semiconductor light-emitting device produced in the present example.

In the present example, the aggregate of columnar crystals made of AlN was formed on the c plane of the substrate 11 made of sapphire as the buffer layer 12 using an RF sputtering method. The ground layer 14a and the n-type contact layer 14b were formed thereon as the n-type semiconductor layer 14 using an RF sputtering method that used Ga in a liquid state as a target. On the n-type contact layer 14b, the n-type clad layer 14c was formed using a MOCVD method. Then, the light-emitting layer 15 was formed thereon using a MOCVD method. On the light-emitting layer 15, the p-type clad layer 16a, and the p-type contact layer 16b were formed as the p-type semiconductor layer 16 using an RF sputtering method this order.

At first, the substrate 11 made of sapphire, the one side of which had been mirror finished so as to be used for the epitaxial growth, was introduced into the sputtering apparatus without being particularly subjected to a wet-type pretreatment, etc. Here, as the sputtering apparatus, there was employed the apparatus having a high frequency-type power supply and a mechanism capable of moving a position of a magnet within a target.

Then, the substrate 11 was heated to 750° C. in the sputtering apparatus, into which only a nitrogen gas was introduced at a flow rate of 15 sccm. Thereafter, the pressure in the chamber was maintained at 0.08 Pa, a high frequency bias of 50 W was applied to the substrate 11, and the substrate 11 was exposed to nitrogen plasma, to thereby wash the surface of the substrate 11.

Subsequently, an argon gas and a nitrogen gas were introduced into the sputtering apparatus, and then the temperature of the substrate 11 was lowered to 500° C. Then, no bias was applied to the substrate 11 side, a power of 1 W/cm$^2$ was applied to the metal Al target side, the pressure in the furnace was maintained at 0.5 Pa, the Ar gas and the nitrogen gas were circulated at a flow rate of 5 sccm and was 15 sccm, respectively. Under these conditions (nitrogen ratio in the total gas was 75%), the buffer layer 12 made of AlN was formed on the substrate 11 made of sapphire.

The magnet in the target was rotated at both timings of the washing of the substrate 11 and the film formation.

Then, the process was performed for the predetermined time at the previously measured film formation rate (0.12 nm/s). On completion of formation of the AlN film (the buffer layer 12) with a thickness of 50 nm, the plasma operation was stopped, and the temperature of the substrate 11 was lowered.

Next, the substrate 11 formed with the buffer layer 12 was removed from the sputtering apparatus and transferred into another sputtering apparatus, where the sample obtained by forming the GaN layer (Group III nitride compound) was produced in the following manners.

Here, as the sputtering apparatus for forming the GaN layer, there was employed the sputtering apparatus having a high frequency-type power supply and a mechanism capable of moving a position influenced by the magnetic field using a magnet which sweeps across within the square Ga target. Also, a cooling device such as a refrigerant was not equipped in the sputtering target 47 made of Ga or on the target board 43, and Ga was used in a liquid state.

At first, an argon gas and a nitrogen gas were introduced into the chamber, and then the temperature of the substrate 11 was raised to 1000° C. Then, a high frequency bias of 0.5 W/cm$^2$ bias applied to the substrate 11 side, a power of 1 W/cm$^2$ was applied to the metal Ga target side, the pressure in the chamber was maintained at 0.5 Pa, and the Ar gas and the nitrogen gas were circulated at a flow rate of 5 sccm and 15 sccm, respectively. Under these conditions (nitrogen ratio in the total gas was 75%), the GaN layer was formed on the substrate 11 made of sapphire (on the buffer layer 12). The growth rate at this time was about 1 nm/s. On completion of formation of the GaN layer with a thickness of 6 nm, the plasma operation was stopped.

Subsequently, the Si-doped GaN layer having a thickness of 2 μm and an electron concentration of $1 \times 10^{19}$ cm$^{-3}$ was formed under the same conditions. The respective conditions for the film formation were the same as for the undoped GaN layer. The ions discharged from the ion gun were sent toward the Si target set within the chamber, to thereby withdraw and dope Si.

By the process as described above, the buffer layer 12 having a columnar structure made of AlN was formed on the substrate 11 made of sapphire, on which the undoped GaN layer (the ground layer 14a) with a thickness of 6 μm was formed. Furthermore, on the undoped GaN layer, the Si-doped GaN layer (n-type contact layer 14b) with a carrier concentration of $1 \times 10^{19}$ cm$^{-3}$ was formed, to thereby produce the sample. The sample was colorless and in a mirror state.

Then, the sample was introduced into the MOCVD furnace, and the n-type clad layer 14c and the light-emitting layer 15 were formed thereon.

Firstly, on the n-type contact layer 14b formed as described above was formed the In$_{0.1}$Ga$_{0.9}$N-type clad layer having a thickness of 20 nm and an electron concentration of $1 \times 10^{18}$ cm$^{-3}$ (n-type clad layer 14c). Subsequently, on this layer was formed the light-emitting layer 15 (multiquatum well structure), which was composed of six barrier layers 15a made of GaN with a thickness of 16 nm and five well layers 15b made of non-doped In$_{0.2}$Ga$_{0.8}$N with a thickness of 3 nm, being sandwiched by GaN barrier layers on both sides.

Then, the sample, in which the buffer layer 12, the n-type semiconductor layer 14, and the light-emitting layer 15 were laminated on the substrate 11 in this order, was introduced again into the sputtering apparatus that was the same as the apparatus used for the formation of the ground layer 14a and the n-type contact layer 14b, and the p-type semiconductor layer 16 was formed.

Firstly, on the light-emitting layer 15 formed as described above was formed the p-type clad layer 16a made of Mg-doped Al$_{0.1}$Ga$_{0.9}$N having a thickness of 5 nm was formed. On this layer was formed the p-type contact layer 16b made of Mg-doped Al$_{0.02}$Ga$_{0.98}$N having a thickness of 200 nm. The p-type contact layer 16b made of Mg-doped Al$_{0.02}$Ga$_{0.98}$N showed p-type characteristics without performing an annealing process for activating p-type carriers.

The epitaxial wafer (laminated semiconductor 10) for a Group III nitride compound semiconductor light-emitting device illustrated in FIG. 1, which includes the epitaxial layer structure, was finally produced by the aforementioned steps.

Subsequently, the light-emitting diode (see the light emitting device in FIG. 2 and FIG. 3), which is a type of a semiconductor light-emitting device, was produced using the epitaxial wafer (see the laminated semiconductor 10 in FIG. 1) which was produced in the aforementioned steps.

Firstly, in the produced wafer (laminated semiconductor 10), the transparent electrode 17 made of ITO was formed on the surface of the p-type contact layer 16b made of the Mg-doped Al$_{0.02}$Ga$_{0.98}$N layer by a well known photolithographic method. On the transparent electrode 17 was formed the positive electrode bonding pad 18 that has the laminated structure of titanium, aluminum, and gold in this order from the surface of the transparent electrode 17. Furthermore, a part of the wafer was subjected to dry etching to expose the exposed area 14d on the n-type contact layer 14b. Then, on this part was formed the negative electrode 19 formed of the lamination of four layers of Ni, Al, Ti, and Au. By such a procedure, on the wafer were formed the respective electrodes in the shapes as illustrated in FIG. 2 and FIG. 3.

Then, the wafer, in which the electrodes were formed on the both of the n-type semiconductor 14 and the p-type semiconductor 16, was subjected to grinding and polishing on the backside of the substrate 11 to make a mirror-like plane. Then, the wafer was cut into a 350-μm-square chip, and the chip was disposed on a lead frame so that the respective electrodes faced upward, and was connected to the lead fame by gold wires so as to produce the light-emitting device.

A forward current was applied to between the positive electrode bonding pad 18 and negative electrode 19 of the semiconductor light-emitting device (light-emitting diode). As a result the forward voltage at a current of 20 mA was 3.0 V. In addition, the emitting state was observed through the transparent positive electrode 17 on the side of the p-type semiconductor 16, which showed that the emission wavelength was 460 nm and the emission output was 15 mW. Such light-emitting characteristics of the light emitting diode were uniformly obtained in the light emitting diode produced from almost the entire surface of the thus produced wafer.

Comparative Example 1

In Comparative Example 1, the wafer (laminated semiconductor) was produced in the same manner as Example 1 except that the temperature of cooling water that flows into the ground plate for the sputtering target (target stage 43) was adjusted to −20° C. to thereby cooling the target, and the applied power was adjusted to 0.01 W/cm$^2$ so as not to liquefy the target. Then, the wafer was removed from the reaction apparatus, and it was confirmed that the surface of the wafer was a mirror-like plane.

In the wafer produced in the above way, the transparent positive electrode was formed, and the positive boding pad and the negative electrode were formed. Then, the backside of the substrate 11 was grinded and polished to make a mirror-like plane, and the wafer was cut into a 350-μm-square chip. The chip was disposed on a lead frame so that the respective electrodes faced upward, and was connected to the lead frame by gold wires. Then, the light-emitting device was obtained in the same manner as Example 1.

A forward current was applied to between the positive electrode bonding pad and negative electrode of the semiconductor light-emitting device (light-emitting diode) of Comparative Example 1. As a result, the forward voltage at a current of 20 mA was 3.0 V. In addition, the emitting state was observed through the transparent positive electrode on the side of p-type semiconductor, which showed that the emission wavelength was 460 nm and the emission output was 15 mW. Such light-emitting characteristics of the light emitting diode were uniformly obtained in the light emitting diode produced from almost the entire surface of the thus produced wafer.

However, in the method of Comparative Example 1, when the production was continued while using the Ga target in a solid state, the target was disproportionately reduced, and the unevenness of the surface thereof occurred. In addition, the film formation rate became slow, and the distributional difference occurs in the thickness of the film on the substrate. As a result, it became difficult to continue the production of the same wafer under the same conditions.

From the above results, it is apparent that the Group III nitride compound semiconductor light-emitting device according to the present invention has excellent productivity and light emission characteristics.

INDUSTRIAL APPLICABILITY

The Group III nitride compound semiconductor light-emitting device obtained by the present invention has the surface layer made of the Group III nitride compound semiconductor crystal with good crystallinity. Therefore, various semiconductor devices including a light emitting diode and a laser diode, which have excellent light emission characteristics, and electronic devices can be produced.

The invention claimed is:

1. A method for manufacturing a Group III nitride compound semiconductor light-emitting device, comprising
    forming, on a substrate, a semiconductor layer comprised of a Group III nitride compound semiconductor containing Ga as a Group III element by a sputtering method; and
    forming, by the sputtering method, a buffer layer comprised of a columnar crystal between the substrate and the semiconductor layer, wherein
    during the formation of the semiconductor layer, sputtering is performed under the condition where at least the surface layer of a sputtering target comprised of Ga is liquefied, and
    the width of a grain of the columnar crystal constituting the buffer layer is within a range of 0.1 to 100 nm.

2. The method for manufacturing a Group III nitride compound semiconductor light-emitting device according to claim 1, wherein the sputtering target is liquefied by a power applied to the sputtering target.

3. The method for manufacturing a Group III nitride compound semiconductor light-emitting device according to claim 2, wherein the power applied to the sputtering target is set to 0.02 W/cm$^2$ or more.

4. The method for manufacturing a Group III nitride compound semiconductor light-emitting device according to claim 1, wherein the sputtering target is liquefied by heating.

5. The method for manufacturing a Group III nitride compound semiconductor light-emitting device according to claim 1, wherein during the formation of the semiconductor layer, a power is applied to the sputtering target by a high-frequency method or a pulsed DC method.

6. The method for manufacturing a Group III nitride compound semiconductor light-emitting device according to claim 1, wherein during the formation of the semiconductor layer, a magnetic field is rotated or swung for the sputtering target.

7. The method for manufacturing a Group III nitride compound semiconductor light-emitting device according to claim 1, wherein the semiconductor layer is formed by a reactive sputtering method in which a nitride material is circulated in a reactor.

8. The method for manufacturing a Group III nitride compound semiconductor light-emitting device according to claim 7, wherein nitrogen is used as the nitride material.

9. The method for manufacturing a Group III nitride compound semiconductor light-emitting device according to claim 1, wherein the buffer layer is formed of a Group III nitride compound containing Al as a Group III element.

10. The method for manufacturing a Group III nitride compound semiconductor light-emitting device according to claim 9, wherein the buffer layer is formed of AlN.

11. The method for manufacturing a Group III nitride compound semiconductor light-emitting device according to claim 1, wherein the buffer layer is formed so as to cover 90% or more of the surface of the substrate.

12. The method for manufacturing a Group III nitride compound semiconductor light-emitting device according to claim 1, wherein the thickness of the buffer layer is within a range of 10 to 500 nm.

13. The method for manufacturing a Group III nitride compound semiconductor light-emitting device according to claim 1, wherein the buffer layer is formed of AlN, and the semiconductor layer comprised of the Group III nitride compound is formed of GaN.

14. The method for manufacturing a Group III nitride compound semiconductor light-emitting device according to claim 1, wherein sapphire is used for the substrate.

* * * * *